United States Patent [19]

Pizer et al.

[11] 4,173,266

[45] Nov. 6, 1979

[54] LOUDSPEAKER ENCLOSURE

[76] Inventors: Robert S. Pizer, 4007 Connecticut Ave., N.W., Washington, D.C. 20008; Max Tryon, 6008 Namakagan Rd., Bethesda, Md. 20016

[21] Appl. No.: 963,294

[22] Filed: Nov. 24, 1978

[51] Int. Cl.[2] .......... H05K 5/00

[52] U.S. Cl. .......... 181/156; 181/144; 181/152; 181/199

[58] Field of Search .......... 181/156, 153, 144, 154, 181/148, 155, 150, 152, 145, 159, 188, 199, 194; 179/1 E, 115.5 H

[56] References Cited

U.S. PATENT DOCUMENTS

| | | | |
|---|---|---|---|
| 1,791,173 | 2/1931 | Thorington | 181/144 |
| 2,206,012 | 7/1940 | Hart | 181/156 |
| 2,491,982 | 12/1949 | Kincart | 181/156 |
| 2,604,182 | 7/1952 | Massa | 181/159 |
| 2,765,864 | 10/1956 | Glenn | 181/159 |
| 2,866,513 | 12/1958 | White | 181/156 |
| 2,971,598 | 2/1961 | Sieler | 181/152 |
| 3,898,384 | 8/1975 | Goeckel | 181/152 |

FOREIGN PATENT DOCUMENTS

| | | | |
|---|---|---|---|
| 337264 | 10/1930 | United Kingdom | 181/156 |

*Primary Examiner*—Stephen J. Tomsky

*Attorney, Agent, or Firm*—Lawrence E. Laubscher

[57] ABSTRACT

A loudspeaker enclosure is disclosed which includes a horizontal bottom wall, parallel spaced vertical front and rear walls connected with the bottom wall, the front wall containing an opening for receiving a loudspeaker, and a horizontal top wall connected with the upper edges of the front and rear walls. The invention is characterized by the provision of vertical baffle walls which define a converging compression chamber behind the loudspeaker opening in the front wall, and a pair of exponential folded horns arranged laterally on opposite sides of the compression chamber. Each of the baffle walls between the compression chamber and the folded horns contains at least one opening adjacent its forward eage, each of the openings having a generally trapezoidal vertical cross-section, the vertical dimension of the front portion of the opening being greater than the vertical dimension of the rear portion of the opening. The bass-reflex response from the loudspeaker matches the total volume of the compression chamber and the pair of folded horns, which response passes from the compression chamber through the openings and through the pair of exponential folded horns.

6 Claims, 6 Drawing Figures

LOUDSPEAKER ENCLOSURE

BRIEF DESCRIPTION OF THE PRIOR ART

Loudspeaker cabinets including exponential horns are well-known in the art, as evidenced by the patents to Massa U.S. Pat. Nos. 2,604,182, White 2,866,513, and Goeckel 3,898,384. Thus, for example, the Massa patent teaches the use of an exponential horn which acts as a mass reactance coupled to the loudspeaker diaphragm in order to lower the resonant frequency thereof. The White patent discloses a sound generating apparatus including an acoustical connector having a throat portion coupled to a speaker diaphragm, and a mouth portion opening into an enclosed space, wherein the cross-sectional area of the sound path through the throat and mouth increases exponentially. Finally, the Goeckel patent teaches a loudspeaker cabinet including two loudspeakers in combination with an exponential acoustic horn. An orifice is provided for sound passage from first to second exponential portions of the horn.

While the prior loudspeaker enclosures normally operate quite satisfactorily, they do lack the necessary efficiency to deliver smooth frequency response from lowest to highest frequencies.

The most efficient method of sound radiation in a loudspeaker enclosure is presented through a horn which acts as an impedance-matching transformer. For maximum low frequency response, an exponential horn is generally used for high fidelity purposes. For a high efficiency speaker enclosure, the impedance-matching between the loudspeaker driver and the throat of the horn is critical because the frequency response of the horn is limited in the region of the matching frequency by the enormous size required of the horn. To conserve space within the speaker enclosure, a folded horn is often employed. On the other hand, a bass-reflex system—which is a sharply tuned resonant system providing high efficiency over a narrow range of frequencies—may be used to increase the efficiency of the speaker enclosure at the impedance-matching frequency.

The loudspeaker enclosure of the present invention was developed to optimize low frequency response and to deliver smooth frequency response from lowest to highest frequencies in a speaker system by combining the features of an exponential horn and a bass-reflex system. Specifically, an exponential folded horn structure is provided within the enclosure to provide the longest possible horn with the largest possible cross-section within the bass-reflex volume, thereby to make maximum use of the internal volume of the enclosure while maintaining enclosure size to a minimum. The present enclosure further provides a wide-range acoustic coupler and impedance transformer for the coupling between the loudspeaker driver and the horn and for the reflex response of the loudspeaker.

SUMMARY OF THE INVENTION

Accordingly, the primary object of the present invention is to provide an improved loudspeaker enclosure including vertical baffle walls defining a rearwardly converging compression chamber arranged between a pair of exponential folded horns, the baffle walls between the compression chamber and the horns each containing adjacent its forward edge at least one through opening. In accordance with an important feature of the invention, each opening has a generally trapezoidal cross-sectional configuration the forward portion of which has a greater vertical dimension than the rearward portion, whereby the openings present an expanding cross-section matching the expanding volume of the folded horns. Thus, moving from the front to the rear of the opening, the compression chamber looks into a pair of horn throats of constant volume. Each opening thus serves as a wide-range acoustic coupler and impedance transformer and the compression chamber and folded horns serve as the bass-reflex volume for the loudspeaker enclosure.

According to a further object of the present invention, a loudspeaker enclosure is provided wherein the folded horns combined with the bass-reflex volume have throat portions of increasing bandwidth which minimize the impedance change over a greater range than a horn alone to thereby improve the low-frequency response of a bass-reflux system alone.

It is an additional object of the invention to provide a loudspeaker enclosure which may be placed in a room corner or which may be free standing with a minimal compromise in performance.

According to another object, the baffle walls defining each of the exponential folded horns are connected to define a unitary assembly which are arranged within the enclosure to define therebetween the rearwardly converging compression chamber. Consequently, accurate rapid assembly of the enclosure components is afforded.

BRIEF DESCRIPTION OF THE FIGURES

Other objects and advantages of the invention will become apparent from a study of the following specification when viewed in the light of the accompanying drawing, in which.

DETAILED DESCRIPTION

Figure 1:
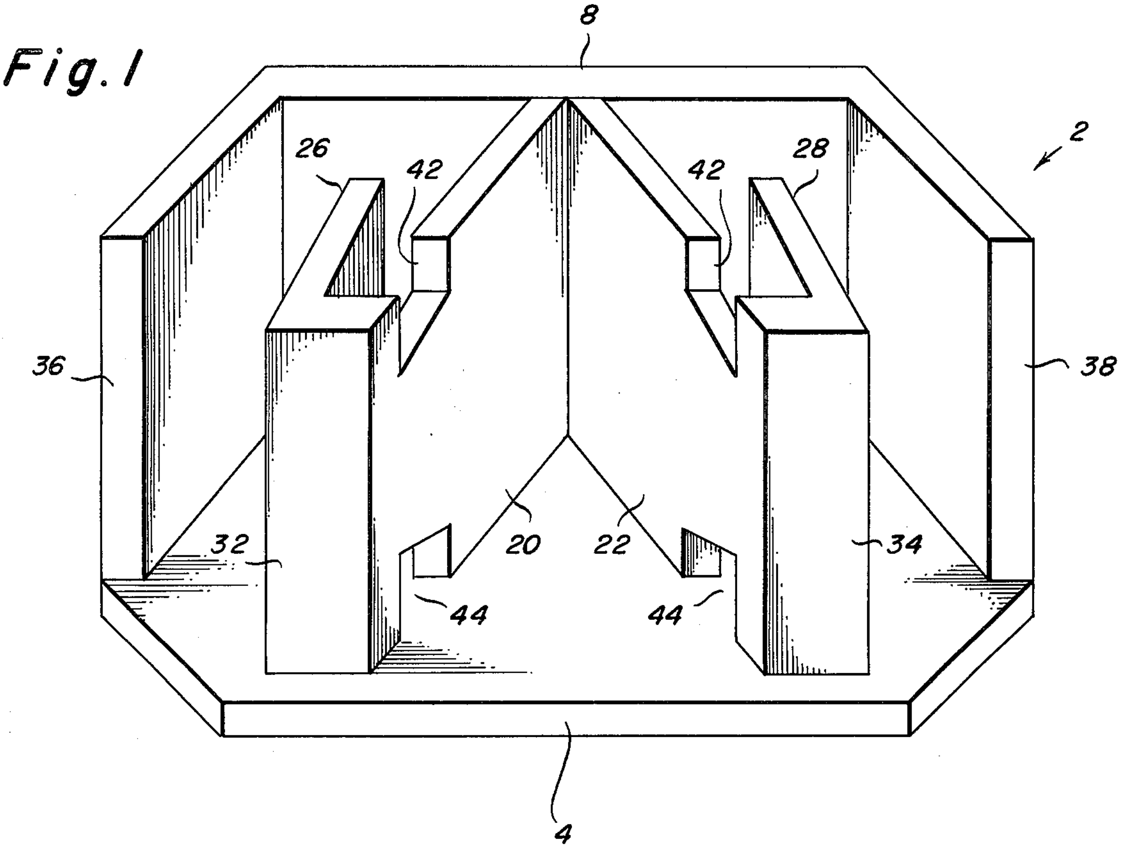
FIG. 1 is a perspective view taken from the front and top of the loudspeaker enclosure with the front and top walls removed.
Figure 2:
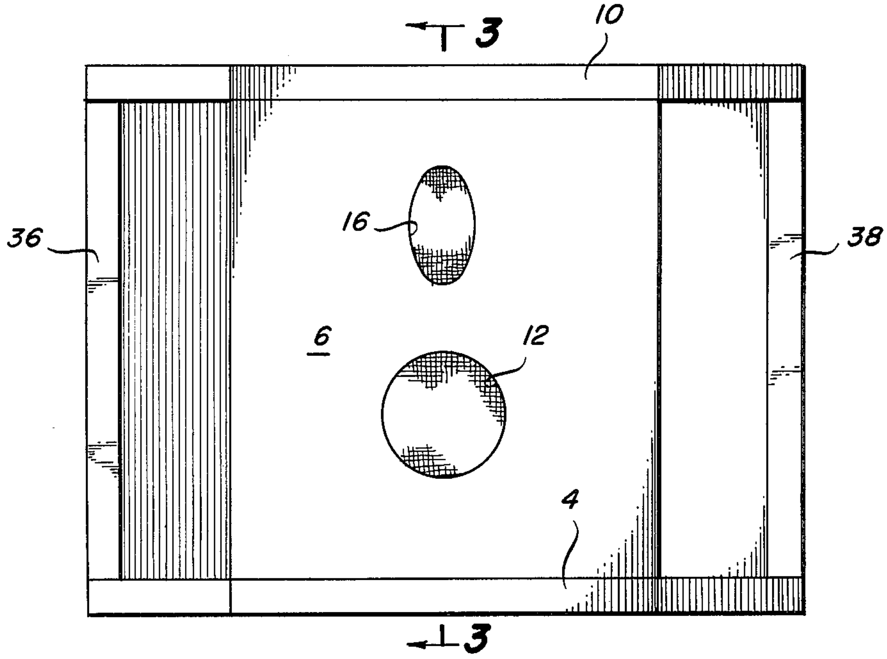
FIG. 2 is a front plan view of the loudspeaker enclosure.
Figure 3:
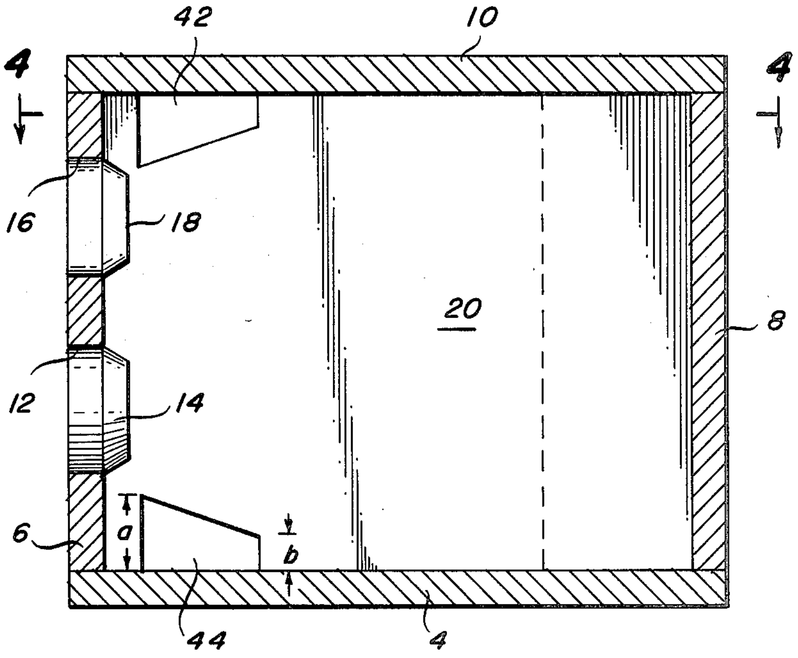
FIG. 3 is a sectional view taken along lines 3—3 of FIG. 2.

Referring first to FIGS. 1 and 3, the loudspeaker enclosure 2 includes a horizontal bottom wall 4 and a pair of vertical parallel spaced front and rear walls 6 and 8 respectively, which are mounted on the upper surface of the bottom wall. A horizontal top wall 10 is connected with the upper edges of the front and rear walls. As shown in FIGS. 2 and 3, the front wall contains at least one opening 12 centrally arranged relative to the front wall side edges for receiving a loudspeaker 14. If desired, a second opening 16 may also be provided in the front wall for receiving a second loudspeaker 18, whereby the loudspeakers serve as a woofer and a tweeter, respectively. It will be readily apparent to those skilled in the art that additional openings may be provided in the front wall for receiving additional loudspeakers, if desired.

Figure 4:
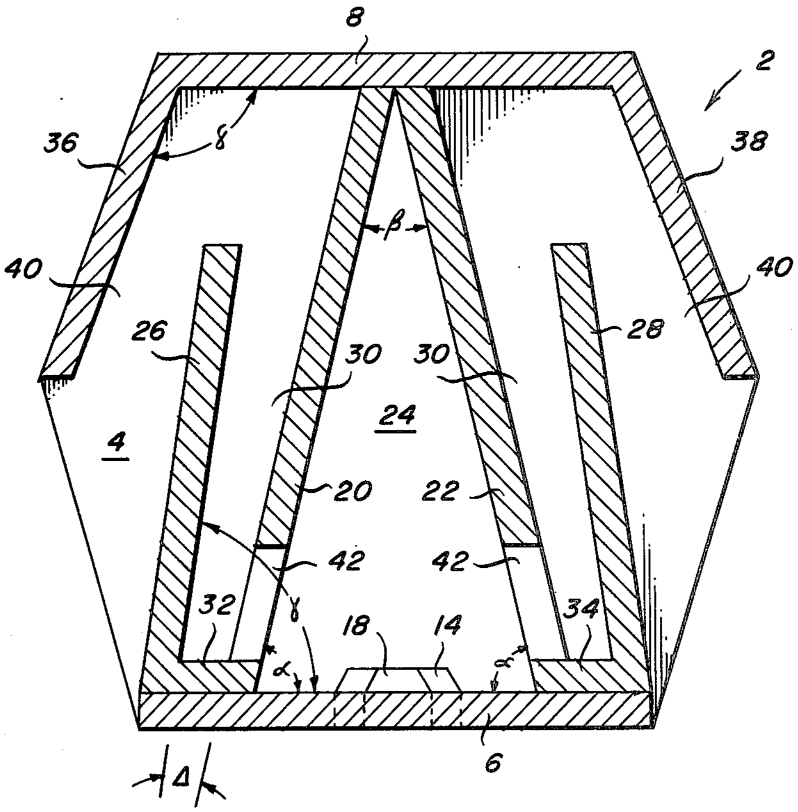
FIG. 4 is a sectional view taken along lines 4—4 of FIG. 3.

A plurality of vertical baffle walls are mounted in the enclosure as shown in FIGS. 1 and 4. All of the baffle walls extend continuously between the horizontal bottom and top walls 4 and 10, respectively. A pair of first baffle walls 20, 22 are arranged within the enclosure with their forward edges spaced equidistant from and on opposite sides of the loudspeaker opening 12 contained in the front wall 6. The first baffle walls 20, 22 are arranged at an acute angle (α) relative to the front wall and converge rearwardly toward a location on the rear wall 8 opposite the loudspeaker opening 12, thereby to define an acute angle of convergency (β) therebetween. A compression chamber 24 is thus defined by the bottom and top walls 4 and 10, respectively, the front wall 6, and the first baffle walls 20, 22.

A pair of second baffle walls 26 and 28 are mounted within the enclosure on opposite sides of the pair of the first baffle walls 20 and 22, respectively. As shown in FIG. 4, the forward edges of the second baffle walls 26, 28 are contiguous with the rear face of the front wall and are spaced laterally outwardly from the forward edges of the first baffle walls. Each of the second baffle walls extends rearwardly at an angle (γ) from the front wall 6 and terminates in spaced relation from the rear wall 8. The second baffle walls 26, 28 are arranged at an angle (Δ) relative to the first baffle walls 20, 22 to define therebetween the first step 30 of a two-step exponential folded horn to be discussed in more detail below.

A pair of third baffle walls 32, 34 are provided (FIG. 4), which extend between the front edge portions of the associated first and second baffle walls, respectively. The third baffle walls are in parallel engagement with the rear surface of the front wall. In a preferred form, the associated ones of the first 20, 22 second 26, 28 and third 32, 34 baffle walls are connected to define unitary horn assemblies which may be readily mounted within the loudspeaker enclosure with the proper angle therebetween. Furthermore, the angle (γ) between the second baffle walls 26, 28 and the front wall 6 is preferably an acute angle so that the second baffle walls also converge rearwardly.

Extending forwardly from the vertical edges of the rear wall 8 are a pair of side baffle walls 36, 38. The rear edges of the side baffle walls are arranged on opposite sides of, and equidistant from, the location on the rear wall opposite the opening 12 contained in the front wall 6. The side baffle walls 36, 38 diverge forwardly at an obtuse angle (δ) relative to the rear wall 8 and extend forwardly beyond the adjacent rear edges of the second baffle walls 26, 28. The second step 40 of a two-step exponential folded horn is thereby defined between the second baffle walls 26, 28 and the side baffle walls 36, 38. The vertical baffle walls thus define within the loudspeaker enclosure a compression chamber 24 and a pair of two-step exponential folded horns arranged on opposite sides of the compression chamber.

Figure 6:
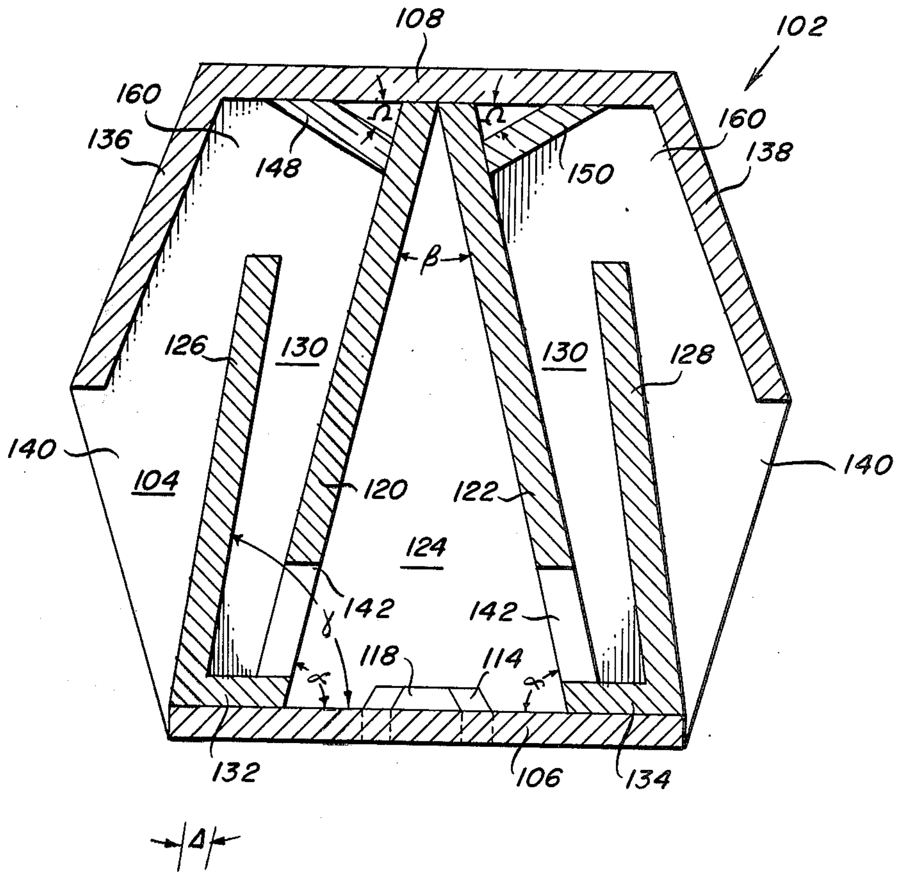
FIG. 6 is a sectional view of a further embodiment of the invention.

In the alternate embodiment of FIG. 6, the loudspeaker enclosure further includes a pair of fourth baffle walls 148, 150 arranged at an acute angle (ω) relative to the rear wall 108. The fourth baffle walls 148,150 extend between the rear wall 108 and first baffle walls 120, 122 and serve as an intermediate step 160 to couple the first step 130 to the second step 140 of a pair of three-step exponential folded horns.

In the preferred embodiment illustrated in FIG. 3, the first baffle walls 20, 22 each contain in its upper and lower edges an opposed pair of trapezoidal openings 42, 44 which openings are adjacent the front end of the associated baffle wall. The vertical dimension (a) of the front portion of each of the openings 44, 46 is greater than the vertical dimension (b) of the rear portion of the openings. The openings in each baffle wall serve as the throat portions for the associated two-step exponential folded horn.

As will be discussed in greater detail below, the size and configuration of the openings in the first baffle walls are such as to increase efficiency of the loudspeaker enclosure. The total volume of the enclosure is governed by the size and self-resonant frequency of the bass loudspeaker. The total area of the openings 44, 46 are governed by the effective piston size of the bass loudspeaker. The openings increase in area in the direction of the front of the enclosure to complement the taper of the horn.

The size of the exponential folded horn is determined in relation to the area of the openings which define the throat portions of the horn. Thus, the angles (γ), (Δ), and (δ), and the length of the rearwardly extending second baffle walls 26, 28 can be computed so that the size of the exponential folded horns is matched to the size of the throat portions for maximum efficiency of the horn.

The area of the throat of a horn is fixed for optimum matching into a given horn. In the embodiment of FIG. 3, the opening is tapered in such a manner as to present an expanding cross-section matching the expanding volume of the first step 30 of each of the exponential folded horns. Thus, moving from the front to the back of the opening, the compression chamber 24 is delivered into a constant volume section of horn which increases the bandwidth of the throat to minimize the impedance change over a greater range of frequencies and thereby provide a wider range of response without peaking. The openings in the first baffle walls 20, 22 function as wide range acoustic couplers and impedance transformers while the compression chamber 24 and the pair of exponential folded horns provide the required bass-reflex volume. Because the bass-reflex volume and the acoustic coupler are arranged within the enclosure, more air is moved through the horn to increase the total sound pressure. The low-frequency response of the loudspeaker is therefore increased without peaking.

Figure 5:
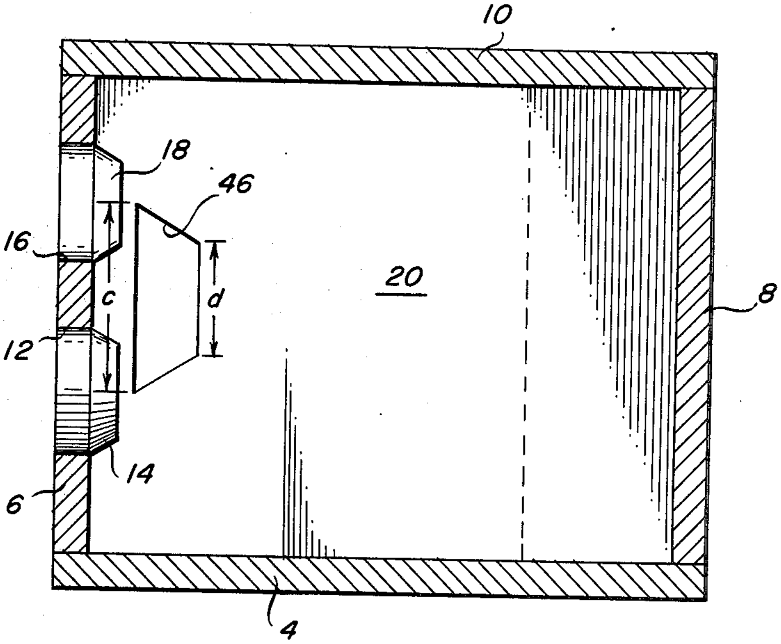
FIG. 5 is a sectional view of an alternate embodiment of the invention.

Referring now to the embodiment of FIG. 5, a single opening 46 is arranged within an adjacent the forward edge of each of the first baffle walls 20, 22, the opening being centrally arranged between the top and bottom enclosure walls. These openings act as the throat portions for each of the exponential folded horns arranged on opposite sides of the compression chamber. As in the embodiment of FIGS. 1–4, the openings each have a trapezoidal vertical cross-section, the vertical dimension (c) of the front portion of the opening being greater than the vertical dimension (d) of the rear portion of the opening. The area of the single opening 46 is equal to the sum of the areas of the openings 42 and 44 of the embodiment of FIGS. 1–4.

In one mode of construction, the exterior walls and baffle walls are planar to define horns of rectangular cross-section and may be constructed from any suitable material such as wood, chipboard and the like in order to provide maximum efficiency of sound energy transfer. Where the horns have a rectangular cross-section, the openings in the first baffle walls will have straight edges. In the alternative, the baffle walls may be formed as curved surfaces from synthetic plastics material, for example, to provide a true exponential horn. In this mode, the openings will have curved edges to properly match the curved cross-section of the true exponential horns.

The improved speaker enclosure wherein the combined volume of the exponential folded horns and the compression chamber act as the bass-reflex volume responds in three ways: as a reflex enclosure for low frequencies; as a direct radiator for mid-to-high frequencies; and as a horn for smooth low frequency response. The variable impedance matching between the horn and loudspeaker extends the frequency coupling range for the horn and reduces the need for critical matching between the driver and horn throat. These features allow the use of a single extended range speaker for both low and mid-to-high frequency response resulting in a smooth continuous output without holes or peaks.

While in accordance with the provisions of the Patent Statutes the preferred forms and embodiments of the invention have been illustrated and described, it will be apparent to those skilled in the art that various changes and modifications may be made without deviating from the inventive concepts set forth above.

What is claimed is:

1. A loudspeaker enclosure, comprising (a) a horizontal bottom wall;

(b) vertical parallel spaced front and rear walls each connected at its lower end with said bottom wall, said front wall containing at least one speaker opening centrally arranged relative to the side edges of said front wall for receiving a loudspeaker;

(c) a horizontal top wall connected with the upper edges of said front and rear walls;

(d) first baffle means defining between said front, rear, bottom and top walls a rearwardly converging compression chamber, said first baffle means including a pair of vertical rearwardly converging first baffle walls, the forward edges of said first baffle walls engaging said front wall at locations equidistant from, and on opposite sides of, said speaker opening, said first baffle walls each being angularly arranged at a first acute angle ($\alpha$) relative to said front wall and converging toward a first location on said rear wall opposite said speaker opening, thereby to define therebetween an acute angle of convergency ($\beta$); and (e) second baffle means for defining a pair of exponential folded horns between said bottom and top walls on opposite sides of said compression chamber, said second baffle means including (1) a pair of vertical second baffle walls extending rearwardly from said front wall on opposite sides of said first baffle walls, the forward edges of said second baffle walls being contiguous with the front wall and spaced laterally outwardly from the forward edges of said first baffle walls, respectively, each of said second baffle walls extending rearwardly at a given angle ($\gamma$) from said front wall and terminating in spaced relation from said rear wall, said second baffle walls being arranged at a given acute angle ($\Delta$) relative to said first baffle walls, respectively; and (2) a pair or vertical forwardly divergent side baffle walls connected at their rear edges with said rear wall at locations on opposite sides of, and equidistant from, said first location, each of said side baffle walls being arranged at an obtuse angle ($\delta$) relative to said rear wall, said side baffle walls extending forwardly beyond the rear edges of said second baffle walls;

(f) each of said first baffle walls containing adjacent its forward edge at least one opening, each of said openings having a trapezoidal vertical cross-section, the vertical dimension of the front portion of each of said openings being greater than the vertical dimension of the rear portion of said openings, whereby the bass-reflux response from the loudspeaker passes from said compression chamber through said openings and through said pair of exponential folded horns.

2. A loudspeaker enclosure as defined in claim 1, wherein said angle ($\gamma$) is an acute angle, whereby said second baffle walls converge rearwardly.

3. A loudspeaker enclosure as defined in claim 2, and further including a pair of vertical third baffle walls extending transversely between the front portions of associated first and second baffle walls, respectively, said third baffle walls being in parallel engagement with said front wall.

4. A loudspeaker enclosure as defined in claim 3, and further including a pair of vertical fourth baffle walls extending between said rear wall and said first baffle walls on opposite sides of said compression chamber, said fourth baffle walls being arranged at an acute angle ($\Omega$) relative to said rear wall.

5. A loudspeaker enclosure as defined in claim 4, wherein each of said first baffle walls contains a single opening centrally arranged between said top and bottom walls.

6. A loudspeaker enclosure as defined in claim 4, wherein each of said first baffle walls contains an opposed pair of openings arranged in the upper and lower edges of said first baffle walls, respectively.

* * * * *